(12) United States Patent
Morishita et al.

(10) Patent No.: US 9,330,835 B2
(45) Date of Patent: May 3, 2016

(54) SIGNAL TRANSMITTING APPARATUS

(75) Inventors: Hidetoshi Morishita, Takahama (JP); Masaki Wasekura, Toki (JP)

(73) Assignee: TOYOTA JIDOSHA KABUSHIKI KAISHA, Toyota-Shi (JP)

( * ) Notice: Subject to any disclaimer, the term of this patent is extended or adjusted under 35 U.S.C. 154(b) by 764 days.

(21) Appl. No.: 13/583,494

(22) PCT Filed: Mar. 9, 2010

(86) PCT No.: PCT/JP2010/053882
§ 371 (c)(1),
(2), (4) Date: Sep. 7, 2012

(87) PCT Pub. No.: WO2011/111168
PCT Pub. Date: Sep. 15, 2011

(65) Prior Publication Data
US 2013/0002040 A1    Jan. 3, 2013

(51) Int. Cl.
*H02J 5/00* (2006.01)
*H01F 38/14* (2006.01)
*H01L 23/522* (2006.01)
(Continued)

(52) U.S. Cl.
CPC ........... *H01F 38/14* (2013.01); *H01L 23/5227* (2013.01); *H01L 27/08* (2013.01); *H04B 5/0031* (2013.01); *H04B 5/0093* (2013.01); *H01F 2038/143* (2013.01); *H01L 2924/0002* (2013.01)

(58) Field of Classification Search
CPC ........... H01F 38/14; H04B 5/00; H04B 5/02; H04B 5/0031; H04B 5/0093; H01L 27/04; H01L 27/08; H01L 23/5227; H01L 21/822
USPC ........................................................ 307/104
See application file for complete search history.

(56) References Cited

U.S. PATENT DOCUMENTS 6,262,600 B1   7/2001   Haigh et al.
6,720,816 B2   4/2004   Strzalkowski
6,903,578 B2   6/2005   Haigh et al.
(Continued)

FOREIGN PATENT DOCUMENTS

FR   2910162 A1    6/2008
JP   07-183468 A   7/1995
(Continued)

OTHER PUBLICATIONS

International Search Report mailed Jun. 1, 2010 & Written Opinion of PCT/JP2010/053882.
(Continued)

*Primary Examiner* — Thienvu Tran
*Assistant Examiner* — David M Stables
(74) *Attorney, Agent, or Firm* — Kenyon & Kenyon LLP

(57) ABSTRACT

A signal transmitting apparatus using a plane coil for a sending coil and a receiving coil respectively, so that the outer diameters of the sending coil and the receiving coil can be decreased, and a signal can be stably transmitted from a sending side to a receiving side. The signal transmitting apparatus is provided with: a sending coil driven by an inputted signal; a receiving coil configured to output a received signal in response to the sending coil being driven; a pre-processing circuit to which the received signal outputted by the receiving coil is inputted; and a detecting circuit configured to detect the inputted signal from a signal outputted by the pre-processing circuit.

4 Claims, 9 Drawing Sheets

(51) Int. Cl.
*H01L 27/08* (2006.01)
*H04B 5/00* (2006.01)

(56) References Cited

U.S. PATENT DOCUMENTS

| | | |
|---|---|---|
| 6,922,080 B2 | 7/2005 | Haigh et al. |
| 7,075,329 B2 | 7/2006 | Chen et al. |
| 2001/0043511 A1 | 11/2001 | Higuchi et al. |
| 2002/0017919 A1 | 2/2002 | Haigh et al. |
| 2003/0128053 A1 | 7/2003 | Haigh et al. |
| 2004/0000968 A1* | 1/2004 | White .......... H01F 41/041 333/185 |
| 2004/0207431 A1 | 10/2004 | Haigh et al. |
| 2004/0246230 A1* | 12/2004 | Oda .......... G06F 3/046 345/156 |
| 2008/0059725 A1* | 3/2008 | Enomoto .......... H01Q 7/00 711/154 |
| 2009/0218407 A1 | 9/2009 | Rofougaran |
| 2010/0060261 A1* | 3/2010 | Cadoux .......... H04B 3/46 324/127 |

FOREIGN PATENT DOCUMENTS

| | | |
|---|---|---|
| JP | 11-084028 A | 3/1999 |
| JP | 2002-066879 A | 3/2002 |
| JP | 2003-523147 A | 7/2003 |
| JP | 2006-324525 A | 11/2006 |
| JP | 2007-329674 A | 12/2007 |
| JP | 2009-267207 A | 11/2009 |
| JP | 2009-276184 A | 11/2009 |
| WO | 01/61951 A1 | 8/2001 |
| WO | WO 2008087276 A2 * | 7/2008 .............. H04B 3/46 |
| WO | 2011/092864 A1 | 8/2011 |

OTHER PUBLICATIONS

International Preliminary Report on Patentability mailed Jan. 6, 2012 of PCT/JP2010/053882.

Shunichi Kaeriyama et al.: "A 2.5kV isolation 35kV/us CMR 250Mbps 0.13mA/Mbps Digital Isolator in Standard CMOS with an on-chip small transformer", 2010 Symposium on VLSI Circuits, Technical Digest of Technical papers, pp. 197-198.

Mamoru Sasaki et al.: "A 0.95m W/1.0Gbps Spiral-Inductor Based Wireless Chip-Interconnect with Asynchronous Communication Scheme", 2005 Symposium on VLSI Circuits, Digest of Technical papers, pp. 348-351.

Baoxing Chen: "iCoupler Products with isoPower Technology: Signal and Power Transfer Across Isolation Barrier using Microtransformers", Analog Devices, 2006, pp. 1-4.

* cited by examiner

SIGNAL TRANSMITTING APPARATUS

This is a 371 national phase application of PCT/JP2010/053882 filed 09 Mar. 2010, the contents of which are incorporated herein by reference.

TECHNICAL FIELD

The present application relates to a signal transmitting apparatus which transmits an inputted signal that is inputted to a sending circuit to a receiving circuit electrically insulated from the sending circuit.

BACKGROUND ART

Japanese Patent Application Publication No. 2006-324525 discloses a signal transmitting apparatus which transmits a signal using electromagnetic induction of a coil. This signal transmitting apparatus has a transformer (sending coil, receiving coil) and a detecting circuit. If the sending coil is driven by the inputted signal, a received signal is outputted from the receiving coil by the electromagnetic induction. The detecting circuit detects the inputted signal from the received signal outputted from the receiving coil. Thereby the signal is transmitted from a sending coil side to a receiving coil side.

SUMMARY OF INVENTION

Technical Problem

In this type of signal transmitting apparatus, a plane coil (plane inductor) may be used for the sending coil and the receiving coil. The plane coil has conductive parts which are disposed in a spiral on a same plane. An advantage of the plane coil over a layered coil, in which conductive parts are disposed three-dimensionally, is a simple structure, since the conductive parts are disposed on the same plane. However, in order to stably transmit a signal, an outer diameter of the sending coil and that of the receiving coil must be increased. As a result, the sending coil and the receiving coil become large, which is a problem.

A gain can be improved by changing a ratio of a number of windings of the sending coil and that of the receiving coil, without increasing the outer diameters of the sending coil and the receiving coil. In other words, the gain can be improved by making the number of windings of the receiving coil to be larger than that of the sending coil. However if the number of windings of the receiving coil is larger than that of the sending coil, in some cases a voltage of the signal outputted from the receiving coil may increase and exceed a withstand voltage of the detecting circuit. Furthermore if the outer diameters of the sending coil and the receiving coil are small, in some cases a frequency of the signal outputted from the receiving coil may become high and exceed a frequency range of a signal that the detecting circuit can receive. As a result, the signal cannot be stably transmitted from the sending side to the receiving side.

With the foregoing in view, the present application was created. An object of the present application is to provide a technique for a signal transmitting apparatus using a plane coil for a sending coil and a receiving coil respectively, so that the outer diameters of the sending coil and the receiving coil can be decreased, and a signal can be stably transmitted from the sending side to the receiving side.

Solution to Technical Problem

A signal transmitting apparatus disclosed in the present application comprises: a sending coil driven by an inputted signal; a receiving coil configured to output a received signal in response to the sending coil being driven; a pre-processing circuit to which the received signal outputted by the receiving coil is inputted; and a detecting circuit configured to detect the inputted signal from a signal outputted by the pre-processing circuit. The sending coil comprises a first conductive part having a first number of windings, and the first conductive part is disposed on a first plane. The receiving coil comprises a second conductive part having a second number of windings that is larger than the first number of windings, and the second conductive part is disposed on a second plane. The pre-processing circuit converts the received signal outputted from the receiving coil into a signal, and outputs the converted signal, and a frequency of the converted signal is within a frequency range of a signal that the detecting circuit can receive, and a voltage of the converted signal is equal to or lower than a withstand voltage of the detecting circuit.

in this signal transmitting apparatus, the number of windings of the receiving coil is larger than that of the sending coil, therefore a gain required for stably transmitting a signal can be obtained without increasing outer diameters of the sending coil and the receiving coil. On the other hand, if the number of windings of the receiving coil is larger than that of the sending coil and the outer diameters of the sending coil and the receiving coils are small, the voltage of the received signal outputted from the receiving coil may exceed the withstand voltage of the detecting circuit, and the frequency of the signal may exceed the frequency range of the signal that the detecting circuit can receive. However, the pre-processing circuit converts the received signal outputted from the receiving coil into a signal in the frequency range that the detecting circuit can receive, and also converts the received signal into a signal of the voltage that is equal to or lower than the withstand voltage of the detecting circuit. Hence the detecting circuit can stably detect an input signal from the signal outputted from the pre-processing circuit.

In the signal transmitting apparatus of the present application, it is preferable that the sending coil and the receiving coil are configured so that a peak frequency of the received signal outputted from the receiving coil exceeds the frequency range of the signal that the detecting circuit can receive, and the peak voltage of the received signal outputted from the receiving coil exceeds the withstand voltage of the detecting circuit. In other words, the peak voltage of the received signal outputted from the receiving coil is higher as the gain is increased by changing the ratio of the number of winding of the sending coil and that of the receiving coil. The peak frequency of the received signal outputted from the receiving coil may also increase as the outer diameters of the sending coil and the receiving coil are smaller. Therefore, the sizes of the sending coil and the receiving coil may be decreased, and the gain thereof may be increased by configuring the sending coil and the receiving coil so that the peak frequency of the received signal may exceed the frequency range of the signal that the detecting circuit can receive, and the peak voltage of the received signal may exceed the withstand voltage of the detecting circuit.

For the pre-processing circuit, a low-pass filter, that passes a signal whose frequency is equal to or lower than a first predetermined frequency, may be used. If the low-pass filter is used for the pre-processing circuit, the frequency of the received signal outputted from the receiving coil can be decreased, and the peak voltage of the received signal can be decreased.

In the case of using the low-pass filter as the pre-processing circuit, it is preferable that a high-pass filter, that passes a signal whose frequency is equal to or higher than a second predetermined frequency, is disposed between the pre-processing circuit and the detecting circuit.

In this case, the second predetermined frequency may be set to be lower than the first predetermined frequency. The detecting circuit may detect the inputted signal from a signal outputted by the high-pass filter. Since noise components are removed by the high-pass filter if this configuration is used, the detecting circuit can more stably detect a sent signal. Further, a signal which passed the low-pass filter may be processed by the high-pass filter, hence the total of capacitance values of the circuits can be decreased.

For the pre-processing circuit, a clamping circuit, that clamps a received signal inputted from the receiving coil to a predetermined voltage, may be used. By using the clamping circuit for the pre-processing circuit, the peak voltage of the received signal outputted from the receiving coil may be clamped to a voltage that is equal to or lower than the withstand voltage of the detecting circuit. Further, the frequency of the, received signal outputted from the receiving coil can be decreased using a function of a parasitic capacitance or the like in the clamping circuit.

DESCRIPTION OF EMBODIMENTS

[Embodiment 1]

Figure 1:
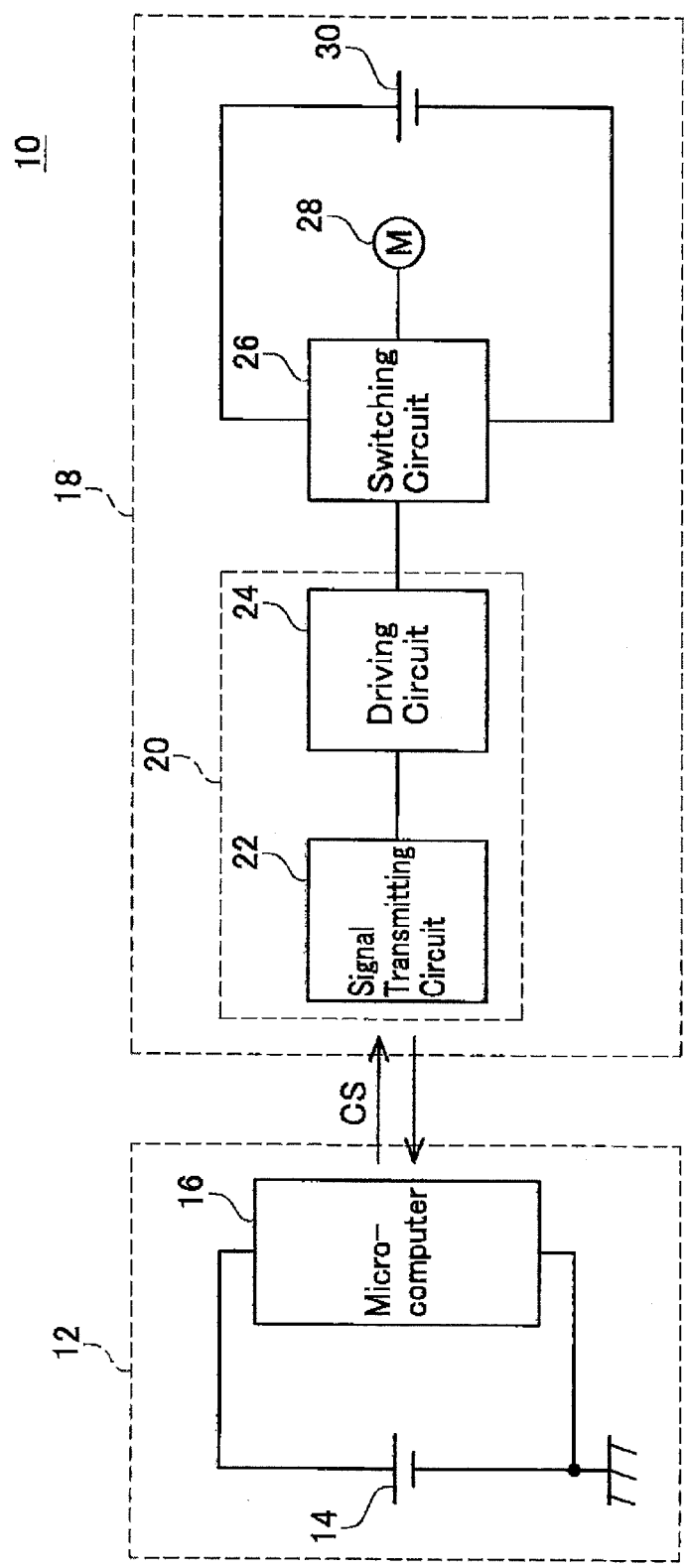
FIG. 1 is a circuit diagram depicting a motor driving system of Embodiment 1.

A signal transmitting apparatus of Embodiment 1 of the present application will now be described with reference to the drawings. The signal transmitting apparatus of this example is used for a motor driving system 10 depicted in FIG. 1. As FIG. 1 shows, the motor driving system 10 comprises a low voltage system circuit 12 and a high voltage system circuit 18. The low voltage system circuit 12 and the high voltage system circuit 18 are insulated from each other. The low voltage system circuit 12 comprises a low voltage battery 14 and a micro-computer 16. The micro-computer 16 outputs a control signal CS. The control signal CS is a signal for controlling the switch operation of a switching circuit 26.

The high voltage system circuit 18 comprises a control circuit 20, a switching circuit 26, a motor 28 and a high voltage battery 30. The control circuit 20 comprises a signal transmitting circuit (an example of the signal transmitting apparatus of the present application) 22, and a driving circuit 24. The signal transmitting circuit 22 is a circuit having an insulation signal device. The signal transmitting circuit 22 transmits the control signal CS outputted from the micro-computer 16 to the driving circuit 24 in a state of maintaining insulation. A miniature device, such as an on-chip transformer, is used as the insulation signal device, whereby the control circuit 20 is configured as an IC, integrating the signal transmitting circuit 22 and the driving circuit 24. The driving circuit 24 drives a switching circuit 26 in response to the control signal CS. Thereby rotation of the motor 28 is controlled.

Figure 2:
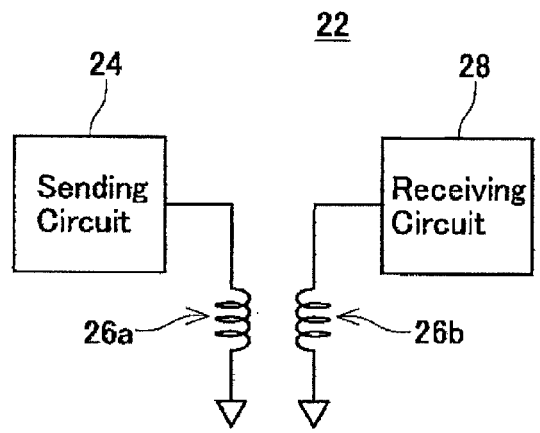
FIG. 2 is a circuit diagram depicting a signal transmitting circuit of Embodiment 1.

As FIG. 2 shows, the signal transmitting circuit 22 comprises a sending circuit 24, a transformer (26a, 26b) and a receiving circuit 28. The sending circuit 24 and the receiving circuit 28 are insulated by the transformer (26a, 26b). An input signal is inputted to an input terminal of the sending circuit 24, and an output signal is outputted from an output terminal of the receiving circuit 28.

The sending circuit 24 drives a sending coil 26a of the transformer in response to the input signal inputted to the input terminal. Various known methods can be used for the method for driving the sending coil 26a. An example of the method is driving the sending coil 26a so that current in a positive direction flows to the sending coil 26a in response to a rise edge of the input signal, and current in a negative direction flows to the sending coil 26a in response to a fall edge of the input signal. The sending circuit 24 can be configured by an H-bridge circuit, for example.

The transformer (26a, 26b) comprises the sending coil 26a and a receiving coil 26b. The sending coil 26a and the receiving coil 26b are plane coils and are electrically insulated. A number of windings of the receiving coil 26b is larger than a number of windings of the sending coil 26a. The sending circuit 24 is connected to the sending coil 26a, and the receiving circuit 28 is connected to the receiving coil 26b.

Figure 3:
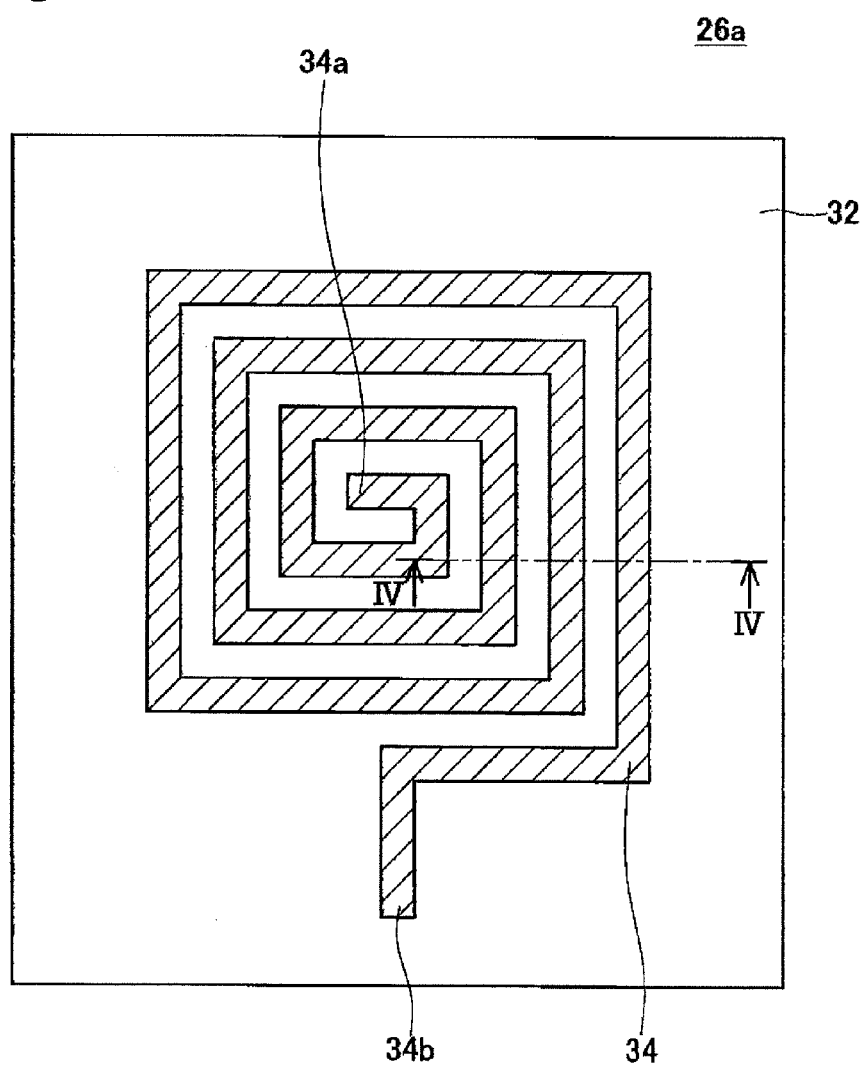
FIG. 3 is a plan view of a transformer of Embodiment 1, sectioned at a plane that includes a receiving coil.

A configuration example of the transformer (26a, 26b) is described with reference to FIG. 3 and FIG. 4. As FIG. 4 shows, the transformer (26a, 26b) is formed on an SOI (Silicon-On-Insulator) substrate which has a bottom substrate 38, an insulation layer 36 contacting a front face of the bottom substrate 38, and a p-type semiconductor layer 32 contacting a front face of the insulation layer 36.

A semiconductor layer coil 34 constituted by an n-type semiconductor layer is formed on the front face of the p-type semiconductor layer 32. A metal oxide layer 40 is formed on the front face of the semiconductor layer coil 34. The metal oxide layer 40 is formed for example of titanium silicide (TiSix), cobalt silicide (CoSix), tungsten silicide (WSix) and molybdenum silicide (MoSix). As FIG. 3 shows, the semiconductor layer coil 34 is famed in a spiral (plane spiral) on the front face of the p-type semiconductor layer 32. The metal oxide layer 40 is also formed in a spiral on the front face of the semiconductor layer coil 34. The edges 34a and 34b of the semiconductor layer coil 34 are connected to the sending circuit 24. The sending coil 26a is constituted by the semiconductor layer coil 34.

Figure 4:
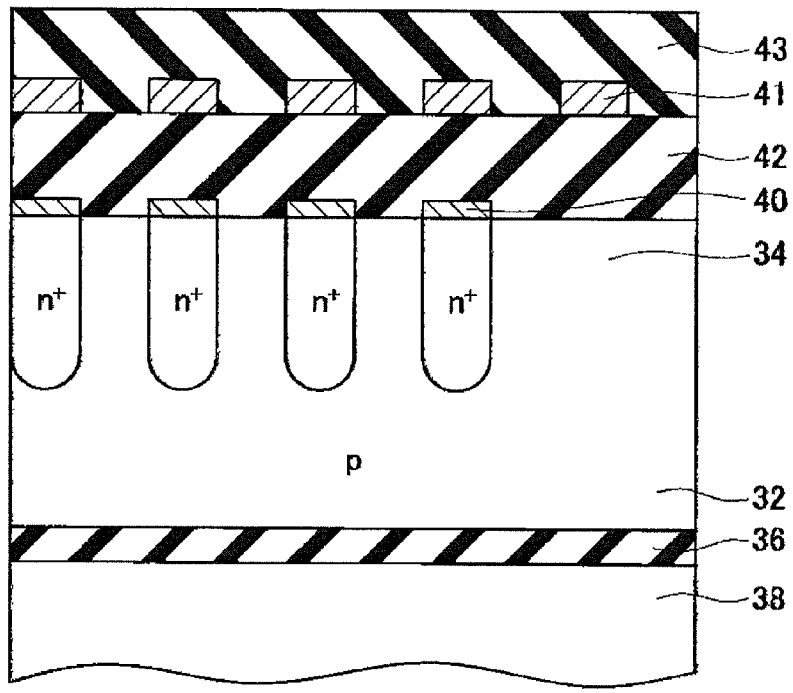
FIG. 4 is a cross-sectional view of the transformer of Embodiment 1, sectioned at the VI-VI line in FIG. 3.

As FIG. 4 shows, the front faces of the metal oxide layer 40 and the semiconductor layer 32 are covered with a coil insulation layer 42. A metal layer coil 41, which is a metal layer, is formed on a front face of the coil insulation layer 42. Just like the semiconductor layer coil 34, the metal layer coil 41 is formed in a spiral (plane spiral) on the front face of the coil insulation layer 42. As FIG. 4 shows, a number of windings of the metal layer coil 41 is larger than a number of windings of the semiconductor layer coil 34. The front face of the metal layer coil 41 is covered with an insulation layer 43. The semiconductor layer coil 34 and the metal layer coil 41 are insulated by the coil insulation layer 42. An edge of the metal layer coil 41 is connected to the receiving circuit 28. The receiving coil 26b is constituted by the metal layer coil 41.

Figure 5:
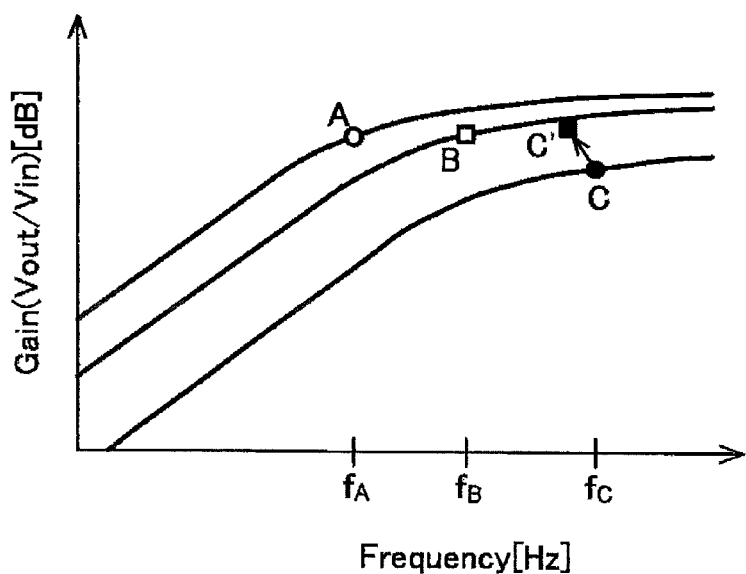
FIG. 5 is a graph depicting a result of calculating a "gain-frequency" characteristic of the transformer, using an outer diameter of a coil as a parameter.

Now the characteristics of the transformer (26a, 26b) of this example will be described. FIG. 5 qualitatively shows "gain-frequency" characteristic when an outer diameter of the plane coil constituting the transformer (26a, 26b) is changed. In FIG. 5, A shows the characteristic of the transformer of which outer diameter of the coil is large, B shows the characteristic of the transformer of which outer diameter of the coil is mid-sized, and C shows a characteristic of the transformer of which outer diameter of the coil is small. In other words, a relationship of the outer diameter of the coil A>outer diameter of the coil B>outer diameter of the coil C is established. A calculation condition is that a ratio of the number of windings of the sending coil 26a and that of the receiving coil 26b is 1:1.

As FIG. 5 shows, a gain tends to increase as a frequency increases in all cases of the transformer (A) of which outer diameter of the coil is large, the transformer (B) of which outer diameter of the coil is mid-sized, and the transformer (C) of which outer diameter of the coil is small. This is because an impedance of a coil is $R+j\omega L$, and a dividing ratio of $j\omega L$ increases as the frequency increases. The gain of the transformer also increases as the outer diameter of the coil increases. This is because a parasitic resistance R of the transformer decreases and an inductance L increases as the outer diameter of the transformer increases. Further, a peak frequency of a frequency spectrum of the received signal outputted from the receiving coil decreases as the outer diameter of the coil increases. In other words, in the case of the transformer (A) of which outer diameter of the coil is large, the peak frequency of the frequency spectrum of the received signal outputted from the receiving coil is a frequency fA. In the case of the transformer (B) of which outer diameter of the coil is mid-sized, the peak frequency of the frequency spectrum of the received signal outputted from the receiving coil is a frequency fB (>fA). In the case of the transformer (C) of which outer diameter of the coil is small, the peak frequency of the frequency spectrum of the received signal outputted from the receiving coil is a frequency fC (>fB). This means that the gain decreases and the peak frequency of the frequency spectrum of the received signal increases as the outer diameter of the coil of the transformer decreases.

C' in FIG. 5 indicates a gain when the ratio of the number of windings of the sending coil and that of the receiving coil is changed while the outer diameter is the same as that of the transformer (C) whose outer diameter of the coil is small, and the gain obtained when the frequency of the received signal is the peak frequency of the frequency spectrum. As the comparison of C and C' in FIG. 5 clearly shows, the gain of the transformer can be improved by making the number of windings of the receiving coil larger than the number of the windings of the sending coil. However, the peak voltage of the signal outputted from the receiving coil increases since the inductance of the receiving coil, with respect to the inductance of the sending coil, increases.

In this example, priority is making the outer diameter of the coils of the transformer (26a, 26b) small. Hence the outer diameters of the coils and the characteristics (e.g. inductance, parasitic resistance) of each coil are set so that the peak frequency of the frequency spectrum of the received signal outputted from the receiving coil 26b becomes a frequency exceeding a frequency range of a signal that the detecting circuit 47 can receive (can detect). In order to improve the gain of the transformer to compensate the decreases in the outer diameters of the coils of the transformer, the number of windings of the receiving coil 26b is larger than the number of windings of the sending coil 26a. As a result, the peak voltage of the received signal outputted from the receiving coil 26b becomes equal to or higher than a withstand voltage of the detecting circuit 47 (a withstand voltage (normally 6V) of an MOS or a high precision capacitor constituting the detecting circuit 47 to be more exact).

Figure 6:
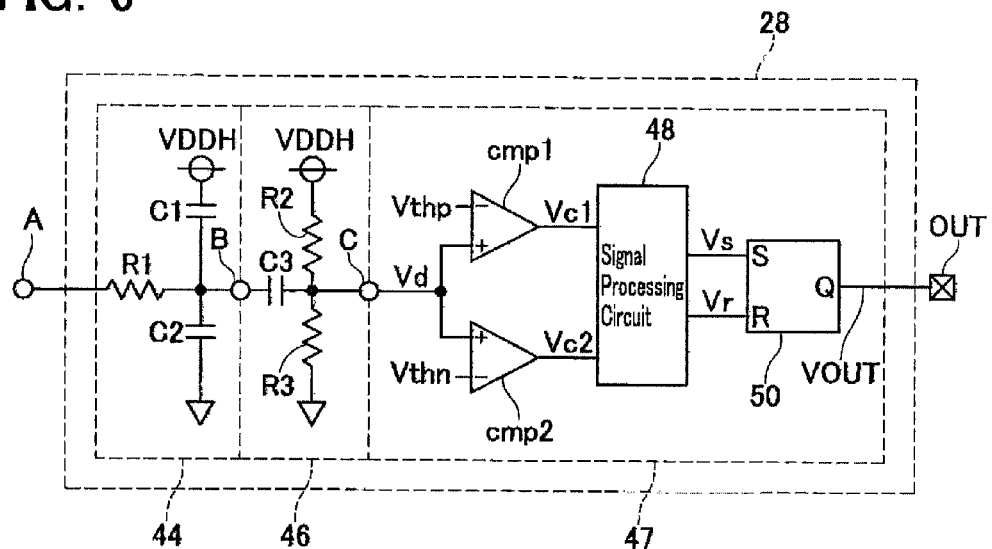
FIG. 6 is a diagram of a configuration of a receiving circuit of Embodiment 1.
Figure 7:
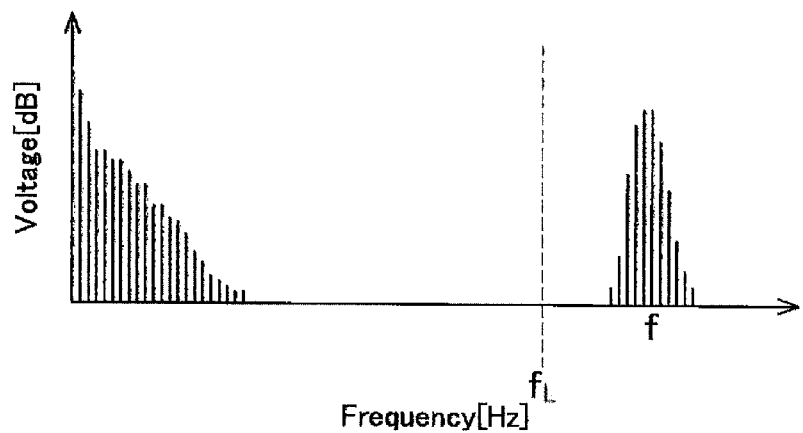
FIG. 7 is a graph depicting a frequency spectrum of a signal outputted from the receiving coil.

Now the receiving circuit 28 is described. As FIG. 6 shows, the receiving circuit 28 comprises a low-pass filler 44, a high-pass filter 46 and the detecting circuit 47. The low-pass filter 44 is constituted by a resistor R1 and capacitors C1 and C2. The receiving coil 26b of the transformer (26a, 26b) is connected to an input terminal A of the low-pass filter 44. This allows to input the signal outputted from the receiving coil 26b to the low-pass filter 44. As FIG. 7 shows, in the received signal outputted from the receiving coil 26b, the peak frequency f exceeds the frequency range fL of the signal that the detecting circuit 47 can receive, and the peak voltage exceeds the withstand voltage of the detecting circuit 47. The low-pass filter 44 integrates and averages the signals (impulse type signals) outputted from the receiving coil 26b. As a result, in a signal outputted from the low-pass filter 44, the frequency peak f' becomes equal to or lower than the frequency range fL of the signal that the detecting circuit 47 can receive, and the peak voltage becomes equal to or lower than the withstand voltage of the detecting circuit 47. A withstand voltage of the resistor R1 used for the low-pass filter 44 is normally 6 to 50 V. This means that even if the peak voltage of the signal outputted from the receiving coil 26b becomes 10 to 15V, exceeding the withstand voltage of the detecting circuit 47 (normally 6 V), the signal can be stably processed by the low-pass filter 44.

Figure 8:
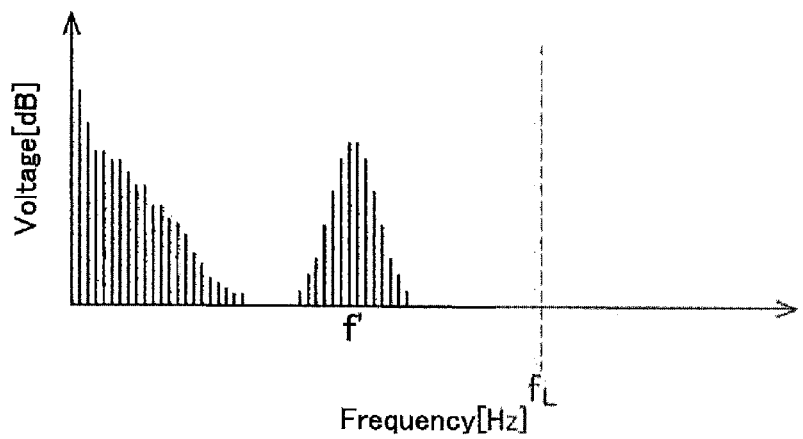
FIG. 8 is a graph depicting a frequency spectrum of a signal outputted from the low-pass filter.

An input terminal of the high-pass filter 46 is connected to an output terminal B of the low-pass filter 44. The high-pass filter 46 is constituted by a capacitor C3 and resistors R2 and R3. As FIG. 8 shows, a signal outputted from the low-pass filter 44 includes low frequency noise components (e.g. common mode noise). The high-pass filter 46 removes the low frequency noise components from the signal outputted from the low-pass filter 44. The signal Vd after the noise components are removed by the high-pass filter 46, is input to the detecting circuit 47. As a result, an S/N ratio improves in the signal transmitting circuit 22 of the present application.

The detecting circuit 47 comprises comparators cmp1 and cmp2, a signal processing circuit 48, and an RS flip-flop 50. A signal Vd, outputted from the high-pass filter 46, is inputted to the non-inversion input terminals of the comparators cmp1 and cmp2 respectively. A threshold Vthp is inputted to an inversion input terminal of the comparator cmp1, and a threshold Vthn is inputted to an inversion input terminal of the comparator cmp2. An output signal Vc1 is outputted from an output terminal of the comparator cmp1, and an output signal Vc2 is output from an output terminal of the capacitor cmp2.

The output signals Vc1 and Vc2 from the comparators cmp1 and cmp2 are inputted to the signal processing circuit 48, and a pulse signal Vs and a pulse signal Vr are outputted from the signal processing circuit 48. The signal processing circuit 48 is a circuit for detecting a rise edge and a fall edge of an input signal inputted to the sending circuit 24. In concrete terms, if the output signal Vc1 is inputted first and the output signal Vc2 is then inputted continuously to the signal processing circuit 48, it is determined that a coil current in the positive direction is generated in the sending coil 26a. Hence it is determined that a rise edge is generated in the input signal to the sending circuit 24, and the pulse signal Vs is outputted from the signal processing circuit 48. If the output signal Vc2 is inputted first and the output signal Vc1 is then inputted continuously to the signal processing circuit 48, it is determined that a coil current in the negative direction is generated in the sending coil 26a. Hence it is determined that a fall edge is generated in the input signal to the sending circuit 24, and the pulse signal Vr is output from the signal processing circuit 48.

The pulse signal Vs is inputted from the signal processing circuit 48 to a set terminal of the RS flip-flop 50, and the pulse signal Vr is inputted from the signal processing circuit 48 to a reset terminal of the RS flip-flop 50. If the pulse signal Vs is inputted, the RS flip-flop 34 outputs a high level output signal VOUT, and if the pulse signal Vr is inputted, the RS flip-flop 34 outputs a low level output signal VOUT.

Figure 9:
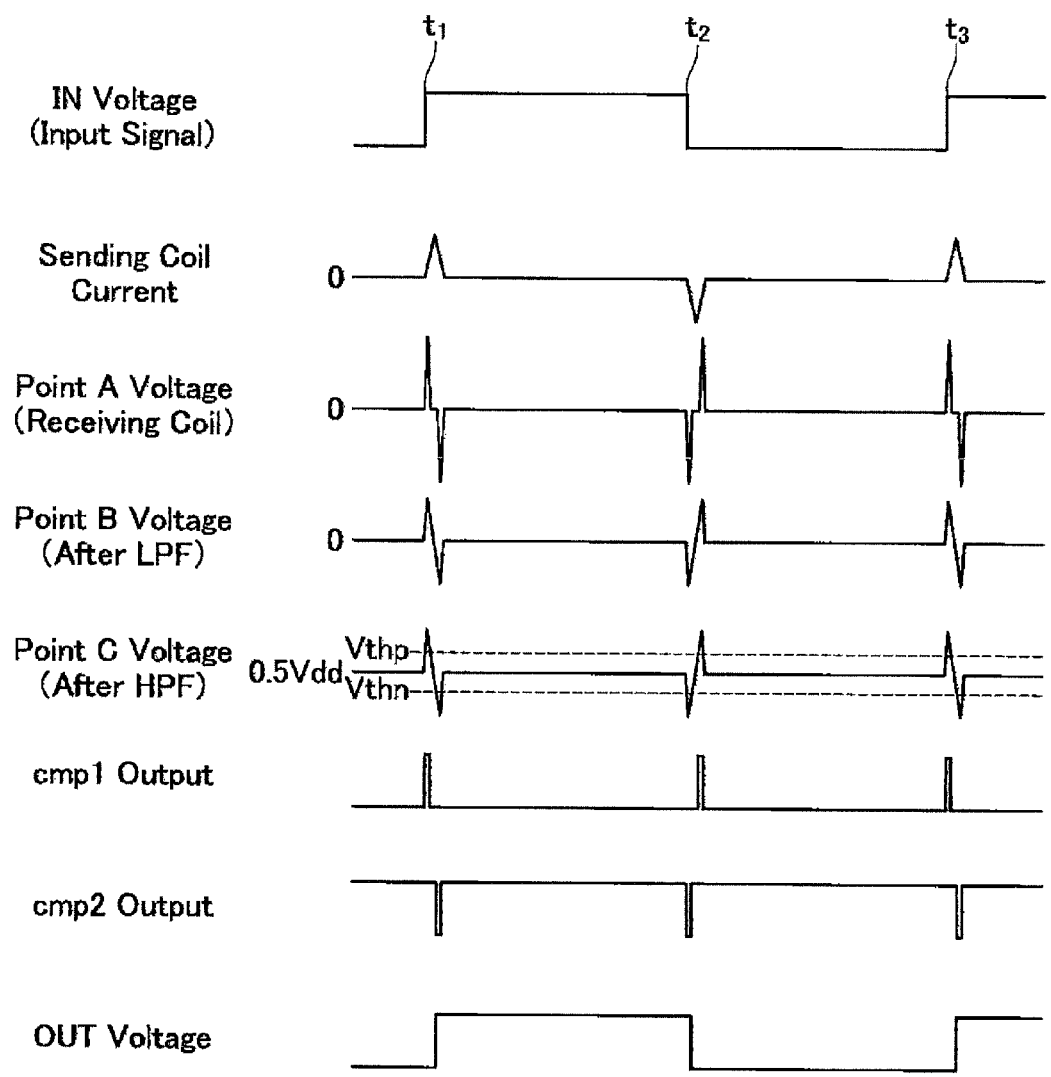
FIG. 9 shows is waveform diagram depicting operation of the receiving circuit of Embodiment 1.

Operation of the signal transmitting circuit 22 is described with reference to an operation waveform diagram in FIG. 9. Period t1 to t2 is a period when the input signal to the sending circuit 24 is at high level, and a period t2 to t3 is a period when the input signal to the sending circuit 24 is at low level.

The operation in the period t1 to t2 is now described. If a rise edge is generated in the input signal to the sending circuit 24 at time t1, the sending circuit 24 drives the sending coil 26a in the positive direction. Thereby the coil current in the positive direction flows into the sending coil 26a.

If the current in the positive direction flows into the sending coil 26a, a secondary voltage (received signal) is generated in proportion to the increase ratio (di/dt) of the coil circuit that flows into the sending coil 26a (point A voltage). In other words, in response to the increase of the current in the sending coil 26a in the positive direction, an impulse voltage in the positive direction is generated in the receiving coil 26b, and in response to the decrease of the current in the sending coil 26a, an impulse voltage in the negative direction is generated in the receiving coil 26b.

The signal generated in the receiving coil 26b is inputted to the low-pass filter 44. The low-pass filter 44 integrates and averages the signals generated in the receiving coil 26b. Thereby a pulse width of a signal outputted from the low-pass filter 44 (point B voltage) increases compared with the signal generated in the receiving coil 26b. In other words, the signal generated in the receiving coil 26b is converted into a signal in a low frequency band. The peak voltage of the signal outputted from the low-pass filter 44 is kept low compared with the signal generated in the receiving coil 26b. Thereby the signal outputted from the low-pass filter 44 is converted into a signal of which frequency is equal to or lower than a frequency range fL of a signal that the detecting circuit 47 can receive, and the peak voltage thereof becomes equal to or lower than the withstand voltage of the detecting circuit 47.

The signal outputted from the low-pass filter 44 is inputted to the high-pass filter 46, whereby low frequency noise components are removed. The signal after the noise components are removed by the high-pass filter 46 (point C voltage) is inputted to the comparators cmp1 and cmp2 of the detecting circuit 47. Then in a period when the signal outputted from the high-pass filter 46 exceeds the threshold Vthp, the output signal Vc1 of the comparator cmp1 becomes high level. In a period when the signal outputted from the high-pass filter 46 does not reach the threshold Vthn, on the other hand, the output signal Vc2 of the comparator cmp2 becomes low level.

The signal processing circuit 48 detects that the pulse of the output signal Vc1 of the comparator cmp1 is inputted first, and the pulse of the output signal Vc2 of the comparator cmp2 is then inputted continuously. Hence the signal processing circuit 48 determines that a rise edge is generated in the input signal inputted to the sending circuit 24, and outputs the pulse signal Vs. Thereby the rise edge of the input signal at time t1 is restored as the output signal.

If a fall edge is generated in the input signal to the sending circuit 24 at time t2, the sending circuit 24 drives the sending coil 26a in the negative direction. Thereby the coil current in the negative direction flows into the sending coil 26a.

If the current in the negative direction flows into the sending coil 26a, the secondary voltage (received signal) is generated in the receiving coil 26b by the electromagnetic induction (point A voltage). In other words, in response to the increase of the current in the sending coil 26a in the negative direction, an impulse voltage in the negative direction is generated in the receiving coil 26b, and in response to the increase of the current in the sending coil 26a in the positive direction, an impulse voltage in the positive direction is generated in the receiving coil 26b.

The signal generated in the receiving coil 26b is inputted to the low-pass filter 44. The low-pass filter 44 integrates and averages the signals generated in the receiving coil 26b. Thereby a signal outputted from the low-pass filter 44 (point B voltage) is converted into a signal in a frequency that is equal to or lower than the frequency range fL of the signal that the detecting circuit 47 can receive, and the peak voltage becomes equal to or lower than the withstand voltage of the detecting circuit 47.

The signal outputted from the low-pass filter 44 is inputted to the high-pass filter 46, whereby low frequency noise components are removed. The signal, after the noise components are removed by the high-pass filter 46 (point C voltage), is inputted to the comparators cmp1 and cmp2 of the detecting circuit 47. Then, in a period when the signal outputted from the high-pass filter 46 does not reach the threshold Vthn, the output signal Vc2 of the comparator cmp2 becomes low level. In a period when the signal outputted from the high-pass filter 46 exceeds the threshold Vthp, on the other hand, the output signal Vc1 of the comparator cmp1 becomes high level.

The signal processing circuit 48 detects that the pulse of the output signal Vc2 of the comparator cmp2 is inputted first, and the pulse of the output signal Vc1 of the comparator cmp1 is then inputted continuously. Hence the signal processing circuit 48 determines that a fall edge is generated in the input signal inputted to the sending circuit 24, and outputs the pulse signal Vr. Thereby the fall edge of the input signal at time t2 is restored as the output signal.

As described above, according to the signal transmitting circuit 22 of Embodiment 1, the gain of the transformer is increased by making the number of windings of the receiving coil 26b larger than the number of windings of the sending coil 26a, even if the outer diameters of the coils of the transformer (26a, 26b) are small. Thereby a stable signal transmission becomes possible. If the outer diameters of the coils of the transformer are small and the number of windings of the receiving coil 26b is larger than the number of windings of the sending coil 26a, the signal outputted from the receiving coil 26b exceeds the withstand voltage of the detecting circuit 47 and exceeds the frequency range of the signal that the detecting circuit 47 can receive. The low-pass filter 44 converts the signal outputted from the receiving coil into a signal whose frequency band is within the frequency range of the signal that the detecting circuit 47 can receive, and sets the peak voltage thereof to be equal to or lower than the withstand voltage of the detecting circuit 47. As a result, the signal transmitting circuit 22 can stably transmit the input signal, to be inputted to the sending circuit 24, to the receiving circuit 28.

Figure 10:
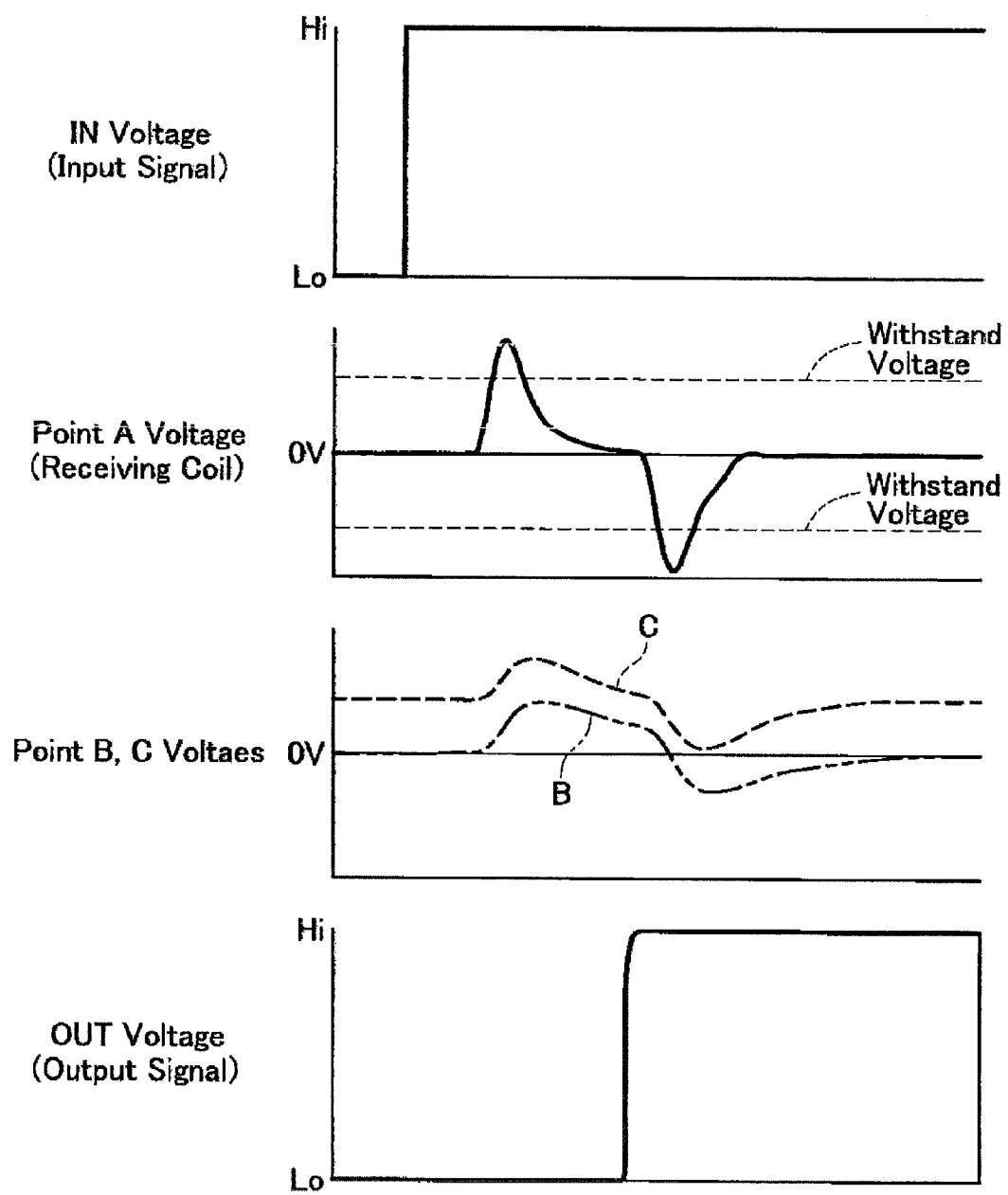
FIG. 10 shows calculation results when signal waveforms of the receiving circuit of Embodiment 1 are determined by simulation.

FIG. 10 shows a result of simulating a signal waveform at each point of the signal transmitting circuit 22 mentioned above. As FIG. 10 shows, if a rise edge is generated in the input signal inputted to the sending circuit 24, the signal generated in the receiving coil 26b (point A voltage) exceeds the withstand voltage of the detecting circuit 47 (normally 6 V). The signal outputted from the low-pass filter 44 (point B voltage) and the signal outputted from the high-pass filter 46 (point C voltage), on the other hand, are kept equal to or lower than the withstanding voltage of the detecting circuit 47. Compared with the signal generated in the receiving coil 26b, these signals (point B voltage, point C voltage) have a wider pulse width. Therefore the detecting circuit 47 can restore the rise edge of the input signal, to be inputted to the sending circuit 24, from the signal inputted from the high-pass filter 46.

Figure 11:
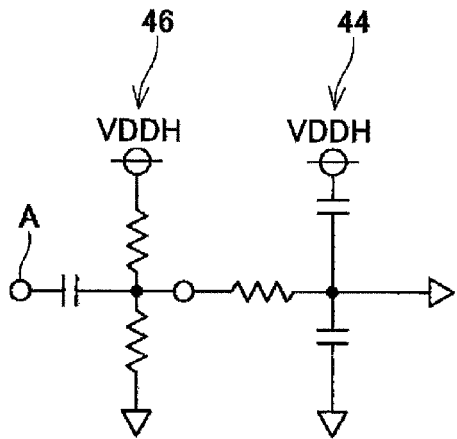
FIG. 11 is a circuit diagram depicting a configuration of a comparison example when a sequence of a low-pass filter and a high-pass filter is reversed.
Figure 12:
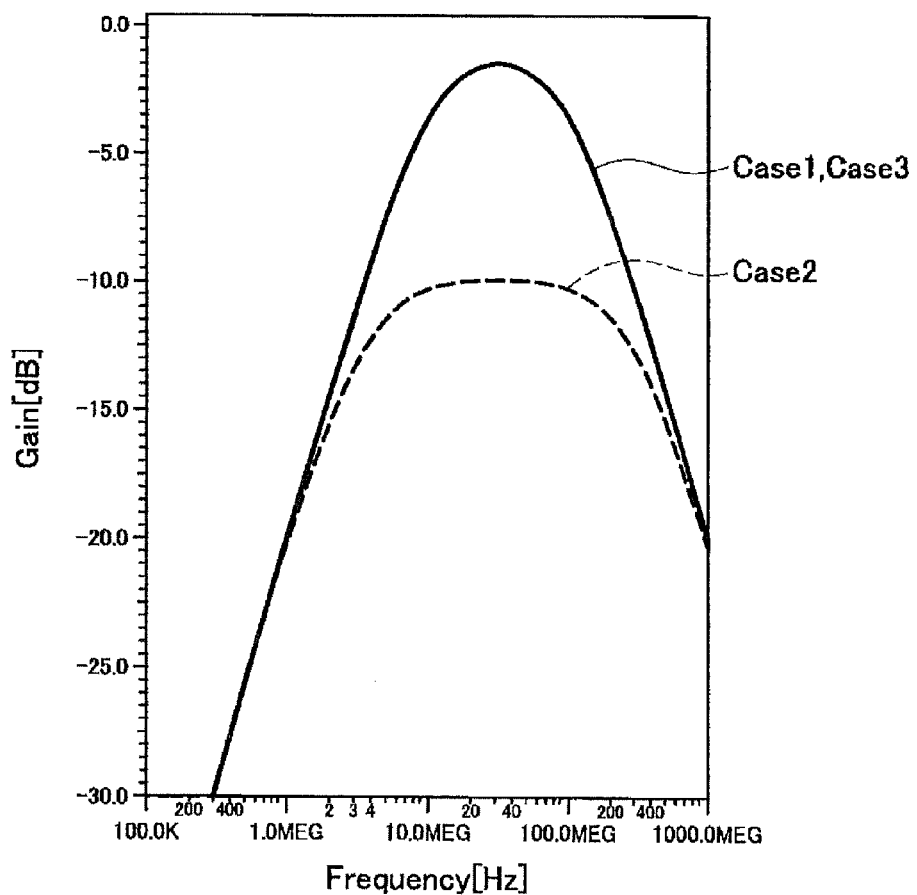
FIG. 12 is a graph depicting a result of calculating a relationship of a gain and the frequency for the circuit shown in FIG. 6 and the circuit shown in FIG. 11.

The signal transmitting circuit 22 of Embodiment 1 is configured to have the high-pass filter 46 disposed in the subsequent stage (the detecting circuit 47 side) of the low-pass filter 44. Therefore comparing with a configuration to have the high-pass filter disposed in the previous stage (receiving coil 26b side) of the low-pass filter 44 (configuration shown in FIG. 11), the total capacitance value of the capacitors can be decreased. In other words, as FIG. 12 and TABLE 1 show, in the case when the resistance of the resistor R1 and the resistance of the capacitors C1 and C2 constituting the low-pass filter 44 and the capacitance of the resistors R2 and R3 and the capacitance of the capacitor C3 constituting the high-pass filter 46 are the same (case 1, case 2), the gain is higher in the configuration disposing the high-pass filter in the subsequent stage of the low-pass filter 44 (case 1) than the configuration disposing the high-pass filter in the previous stage of the low-pass filter (case 2). To obtain the same gain as case 1 using the configuration disposing the high-pass filter in the previous stage of the low-pass filter (case 3), the capacitance value of the capacitor C3 used for the high-pass filter must be increased. Therefore the signal transmitting circuit 22 of Embodiment 1 is configured to have the high-pass filter 46 disposed in the subsequent stage of the low-pass filter 44, so that a high gain can be obtained while the capacitance of the capacitor is kept low. Further, in the case of forming a resistor and a capacitor in an IC, the capacitor requires a larger area than the resistor. Therefore keeping the capacitance of the capacitor low can contribute to forming the signal transmitting circuit 22 in a more compact area.

TABLE 1

| Condition | Sequence | LPF (fc = 100 MHz) | | HPF (fc = 10 MHz) | | Total resistance value | Total capacitance value |
|---|---|---|---|---|---|---|---|
| | | R1 | C1, C2 | R2, R3 | C3 | | |
| Case 1 | LPF → HPF | 1 kΩ | 0.8 pF | 40 kΩ | 0.8 pF | 81 kΩ | 2.4 pF |
| Case 2 | HPF → LPF | 1 kΩ | 0.8 pF | 40 kΩ | 0.8 pF | 81 kΩ | 2.4 pF |
| Case 3 | HPF → LPF | 1 kΩ | 0.8 pF | 1 kΩ | 31.8 pF | 3 kΩ | 33.4 pF |

Figure 13:
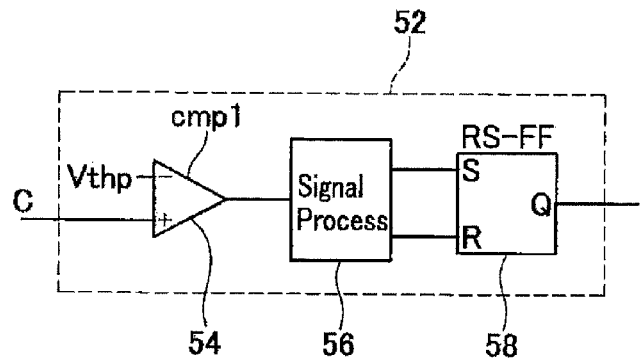
FIG. 13 is a diagram depicting another example of the detecting circuit.

The configuration of each circuit of Embodiment 1 described above is an example, and the techniques described in the present application are not limited to these embodiments. For example, a detecting circuit 52 shown in FIG. 13 may be used. The detecting circuit 52 comprises a comparator cmp1, a signal processing circuit 56 and an RS flip-flop 58. To use this detecting circuit 52, two pulsed currents are supplied to the sending coil 26a in response to the rise edge of the input signal, and supplies one pulsed current to the sending coil 26a in response to the fall edge of the input signal. By driving the sending coil 26a like this, the signal processing circuit 56 can determine whether a rise edge is generated in the input signal, or a fall edge is generated in the input signal.

[Embodiment 2]

A signal transmitting apparatus of Embodiment 2 will now be described. A difference of the signal transmitting apparatus of Embodiment 2 from the signal transmitting apparatus 22 of Embodiment 1 is using a clamping circuit 62, instead of the low-pass filter 44. The other configuration of the signal transmitting apparatus of Embodiment 2 is the same as that of the signal transmitting apparatus 22 of Embodiment 1. Therefore a composing element the same as Embodiment 1 is denoted with a same reference symbol, for which description is omitted.

Figure 14:
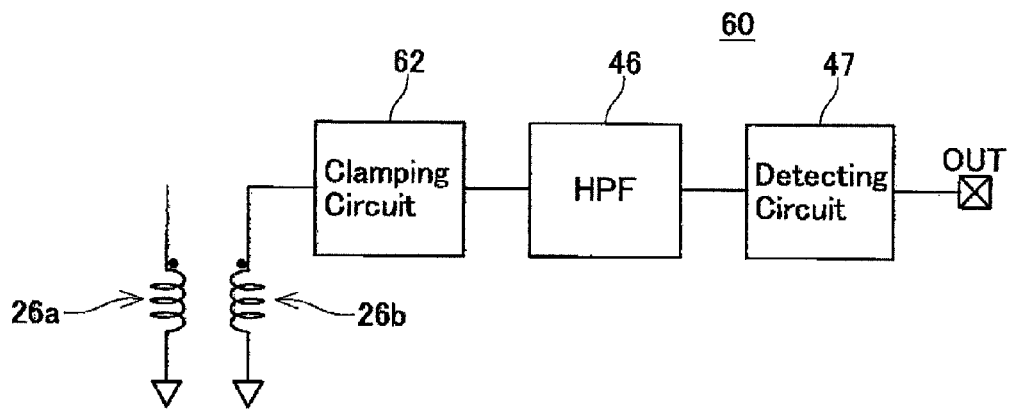
FIG. 14 is a circuit diagram depicting a signal transmitting circuit of Embodiment 2.
Figure 16:
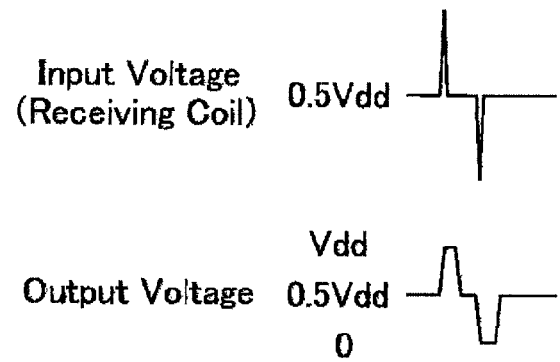
FIG. 16 is a diagram depicting an operation of the clamping circuit.

As FIG. 14 shows, a receiving circuit 60 comprises a clamping circuit 62, a high-pass filter 46 and a detecting circuit 47. A receiving coil 26b is connected to an input terminal of the clamping circuit 62, and a received signal outputted from the receive coil 26b is inputted to the clamping circuit 62. In Embodiment 2, one potential of the receiving coil 26b (i.e., potential of the side not connected to the clamping circuit 62) is biased by 0.5×Vdd (power supply potential). Therefore as FIG. 16 shows, a level of a signal outputted from the receiving coil 26b is shifted by 0.5×Vdd (power supply potential).

Figure 15:
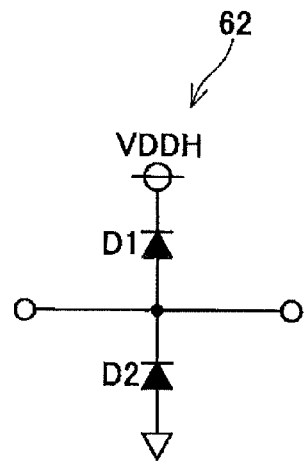
FIG. 15 is a diagram depicting a configuration of a clamping circuit of Embodiment 2.

The clamping circuit 62 has a configuration shown in FIG. 15, for example. In other words, the clamping circuit 62 is constituted by capacitors D1 and D2. As FIG. 16 shows, the clamping circuit 62 clamps a signal outputted from the receiving coil 26b, so as to block exceeding a power supply voltage Vdd, and to block becoming below a ground potential (0 V). Thereby a peak voltage of the signal outputted from the clamping circuit 62 becomes equal to or lower than a withstand voltage of the detecting circuit 47. If the clamping circuit 62 is actually constituted by elements, the clamping circuit 62 has parasitic capacitance. If the clamping circuit 62 is constituted by diodes, as shown in FIG. 15, the diodes constituting the clamping circuit 62 have inverse recovery characteristics. Therefore the pulse width of the signal inputted from the receiving coil 26b increases, and this increased amount is converted into signals in the low frequency band. As a result, in the signal outputted from the clamping circuit 62, the peak voltage becomes equal to or lower than the withstand voltage of the detecting circuit 47, and the frequency band becomes within a frequency range of a signal that the detecting circuit 47 can detect. Therefore in the signal transmitting circuit of Embodiment 2 as well, the input signal inputted to the sending circuit can be stably transmitted to the receiving circuit 60.

Figure 17:
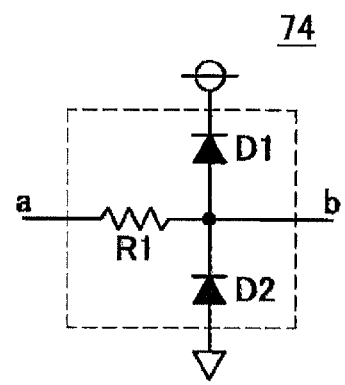
FIG. 17 is a diagram depicting another example of the clamping circuit.

In the above mentioned Embodiment 2, the clamping circuit 62 shown in FIG. 15 is used, but a clamping circuit 74 shown in FIG. 17 may alternately be used. In the clamping circuit 74, a resistor R1 is disposed between the receiving coil and the diodes D1 and D2.

While examples of the present application have been described in detail, such examples are merely illustrative and are not intended to limit the scope of claims. Techniques described in the scope of claims include various modifications and changes of the specific examples illustrated above.

Figure 18:
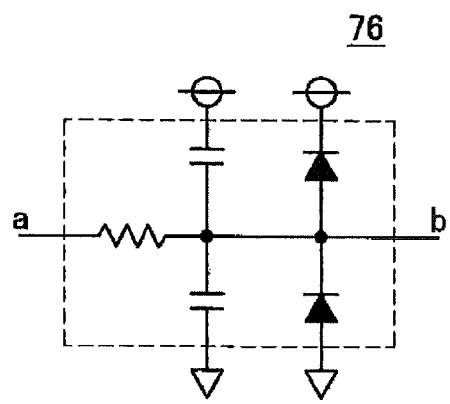
FIG. 18 is a diagram depicting a circuit according to a modification of the present application.

For example, a circuit shown in FIG. 18 may be disposed between the receiving coil 26b and the high-pass filter. The circuit in FIG. 18 is configured by connecting the low-pass filter and the clamping circuit. This circuit may be used to convert the signal outputted from the receiving coil 26b into a signal in the low frequency band, decreasing the peak voltage of the signal outputted from the receiving coil 26b.

It is to be understood that the technical elements described in the present specification and the drawings exhibit technical usefulness solely or in various combinations thereof and shall not be limited to the combinations described in the claims at the time of filing. Furthermore, the techniques illustrated in the present specification and the drawings are to achieve a plurality of objectives at the same time, whereby technical usefulness is exhibited by attaining any one of such objectives.

The invention claimed is:

1. A signal transmitting apparatus comprising:
   a sending coil driven by an inputted signal;
   a receiving coil configured to output a received signal in response to the sending coil being driven;
   a preprocessing circuit to which the received signal outputted by the receiving coil is inputted; and
   a detecting circuit configured to detect the inputted signal by a signal outputted by the preprocessing circuit, wherein
   the sending coil comprises a first conductive part having a first number of windings, the first conductive part being disposed on a first plane,
   the receiving coil comprises a second conductive part having a second number of windings that is larger than the first number of windings, the second conductive part being disposed on a second plane,
   the sending coil and the receiving coil are configured so that a peak frequency of a frequency spectrum of the received signal outputted from the receiving coil exceeds a frequency range of a signal that the detecting circuit can receive, and a peak voltage of the received signal outputted from the receiving coil exceeds a withstand voltage of the detecting circuit, and
   the preprocessing circuit converts the received signal outputted from the receiving coil into a signal and outputs the converted signal, a frequency of the converted signal being within a frequency range of a signal that the detecting circuit can receive, and a voltage of the converted signal being equal to or lower than a withstand voltage of the detecting circuit.

2. The signal transmitting apparatus as in claim 1, wherein the preprocessing circuit is a low pass filter that passes a signal whose frequency is equal or lower than a first predetermined frequency.

3. The signal transmitting apparatus as in claim 2, further comprising a high pass filter disposed between the preprocessing circuit and the detecting circuit, wherein
   the high pass filter passes a signal whose frequency is equal to or higher than a second predetermined frequency,
   the second predetermined frequency is lower than the first predetermined frequency, and
   the detecting circuit detects the inputted signal by a signal outputted by the high pass filter.

4. The signal transmitting apparatus as in claim 1, wherein the preprocessing circuit is a clamping circuit that clamps the signal from the receiving coil to a predetermined voltage.

* * * * *